US006978343B1

(12) United States Patent
Ichiriu

(10) Patent No.: US 6,978,343 B1
(45) Date of Patent: Dec. 20, 2005

(54) ERROR-CORRECTING CONTENT ADDRESSABLE MEMORY

(75) Inventor: Michael E. Ichiriu, Sunnyvale, CA (US)

(73) Assignee: NetLogic Microsystems, Inc., Mountain View, CA (US)

( * ) Notice: Subject to any disclaimer, the term of this patent is extended or adjusted under 35 U.S.C. 154(b) by 29 days.

(21) Appl. No.: 10/213,244

(22) Filed: Aug. 5, 2002

(51) Int. Cl.[7] .............................................. G06F 12/00
(52) U.S. Cl. ......................... 711/108; 711/114; 365/49; 714/6; 714/800
(58) Field of Search .................. 711/108, 114; 365/49, 365/200; 714/1–7, 766, 800

(56) References Cited

U.S. PATENT DOCUMENTS

| | | | | |
|---|---|---|---|---|
| 4,112,502 | A | 9/1978 | Scheuneman | |
| 4,747,080 | A | 5/1988 | Yamada | |
| 5,450,424 | A * | 9/1995 | Okugaki et al. | 714/772 |
| 5,491,703 | A | 2/1996 | Barnaby et al. | |
| 5,796,758 | A | 8/1998 | Levitan | |
| 5,872,802 | A | 2/1999 | Knaack et al. | |
| 5,999,450 | A * | 12/1999 | Dallabora et al. | 365/185.09 |
| 6,014,755 | A * | 1/2000 | Wells et al. | 714/8 |
| 6,067,262 | A * | 5/2000 | Irrinki et al. | 365/201 |
| 6,085,334 | A * | 7/2000 | Giles et al. | 714/7 |
| 6,154,384 | A | 11/2000 | Nataraj et al. | |
| 6,199,140 | B1 | 3/2001 | Srinivasan et al. | |
| 6,243,281 | B1 | 6/2001 | Pereira | |
| 6,657,878 | B2 * | 12/2003 | Lien et al. | 365/49 |
| 6,690,595 | B1 * | 2/2004 | Srinivasan et al. | 365/49 |
| 2002/0083421 | A1 * | 6/2002 | Simons | 717/140 |
| 2002/0120887 | A1 * | 8/2002 | Hughes et al. | 714/42 |

OTHER PUBLICATIONS

"Error Correction with Hamming Codes," pp. 1-2 downloaded Jun. 22, 2001 from URL http://www.rad.com/networks/1994/err_con/hamming.htm.

John R. Pierce, "Inroduction to Information Theory; Symbols, Signals, and Noise" 2nd Edition, 1980, pp. 145-165, Dover Publications, Inc., ISBN 0-486-24061-4.

* cited by examiner

*Primary Examiner*—Nasser Moazzami
(74) *Attorney, Agent, or Firm*—Shemwell Gregory & Courtney LLP

(57) ABSTRACT

A content addressable memory (CAM) device having an error correction function. The CAM device includes an array of CAM cells, row parity storage elements and column parity storage elements. The row parity storage elements store row parity values that correspond to contents of respective rows of the CAM cells, and the column parity storage elements store column parity values that correspond to respective columns of the CAM cells. A bit error in the array is detected through row and column parity checking that uniquely identifies the row and column location of the error and enables correction of the error.

43 Claims, 9 Drawing Sheets

ERROR-CORRECTING CONTENT ADDRESSABLE MEMORY

FIELD OF THE INVENTION

The present invention relates generally to content addressable memory devices, and more particularly to error detection and correction within content addressable memory devices.

BACKGROUND

Content addressable memory (CAM) devices are often used in network switching and routing applications to determine forwarding destinations for data packets. A CAM device can be instructed to compare a selected portion of an incoming packet, typically a destination field within the packet header, with data values, called CAM words, stored in an associative storage array within the CAM device. If the destination field matches a CAM word, the CAM device records a CAM index that identifies the location of the matching CAM word within the storage array, and asserts a match flag to signal the match. The CAM index is then typically used to index another storage array, either within or separate from the CAM device, to retrieve a destination address or other routing information for the packet.

As process geometries shrink, the associative storage arrays of CAM devices, i.e., CAM arrays, become increasingly susceptible to errors induced by alpha-particle bombardment. Such errors are commonly referred to as soft errors and may result in false match or mismatch determinations and ultimately in non-delivery of packets or delivery of packets to incorrect destinations. Accordingly it is desirable to provide some technique for detecting and correcting errors within a CAM device.

In one error detection and correction technique, referred to herein as host-based scanning, a host processor reads the CAM array entry by entry, and compares the array content to an image stored in a backing store (i.e., another memory). Unfortunately this is a relatively slow operation that consumes significant system resources (i.e., in terms of host processing and access port utilization). In another error detection and correction scheme, an error correction code is stored along with each entry within the CAM array and used to detect and correct errors that occur within the entry. Unfortunately, such error correction codes typically require storage of multiple code bits per storage row, significantly reducing the available data storage space within the CAM array.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION

Figure 1:
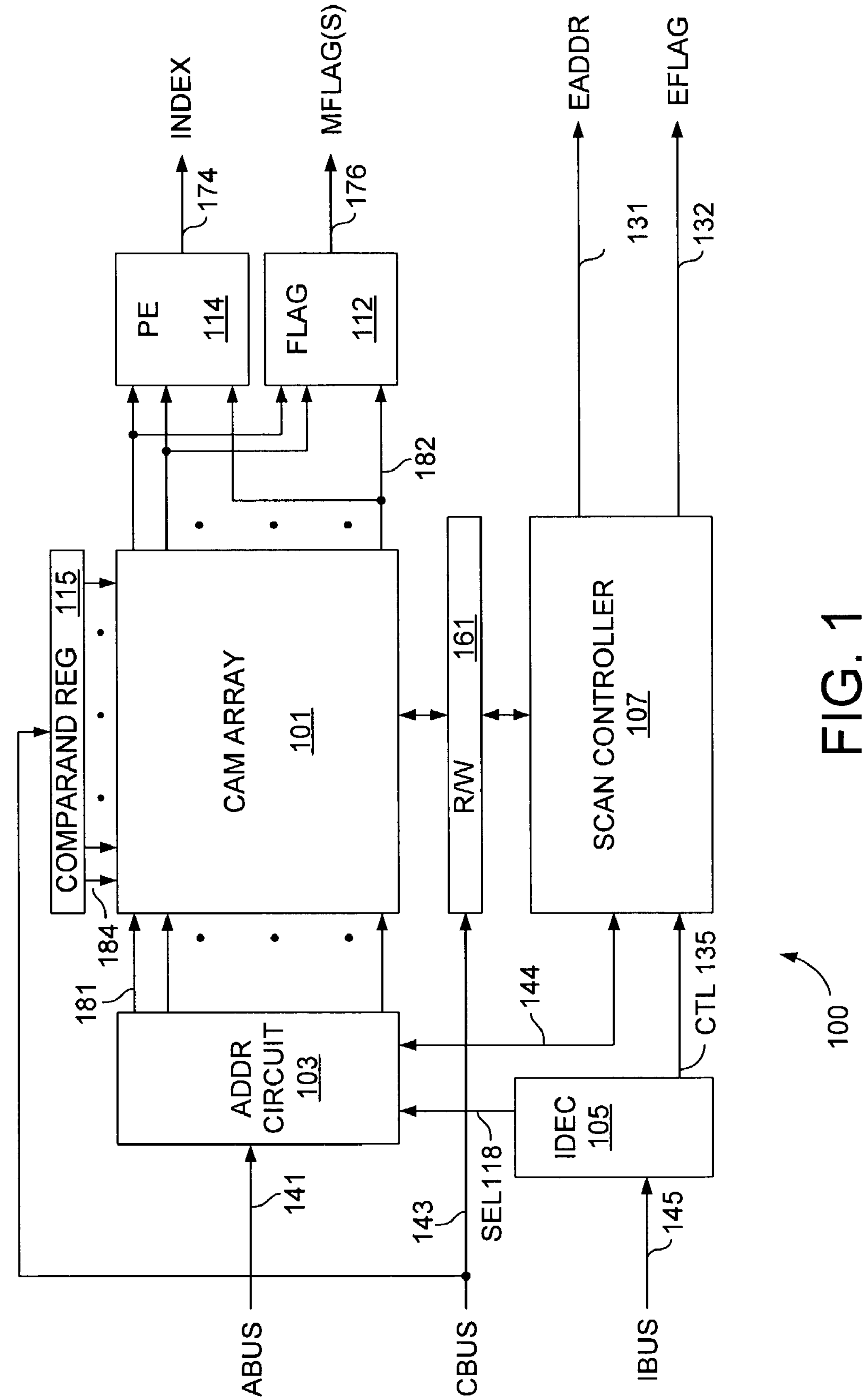
FIG. 1 illustrates a CAM device according to an embodiment of the present invention.

In the following description and in the accompanying drawings, specific nomenclature and drawing symbols are set forth to provide a thorough understanding of the present invention. In some instances, the nomenclature and symbols may imply specific details that are not required to practice the present invention. For example, the interconnection between circuit elements or circuit blocks may be shown or described as multi-conductor or single conductor signal lines. Each of the multi-conductor signal lines may alternatively be single-conductor signal lines, and each of the single-conductor signal lines may alternatively be multi-conductor signal lines. A signal is said to be "asserted" when the signal is driven to a low or high logic state (or charged to a high logic state or discharged to a low logic state) to indicate a particular condition. Conversely, a signal is said to be "deasserted" to indicate that the signal is driven (or charged or discharged) to a state other than the asserted state (including a high or low logic state, or the floating state that may occur when the signal driving circuit is transitioned to a high impedance condition, such as an open drain or open collector condition). A signal driving circuit is said to "output" a signal to a signal receiving circuit when the signal driving circuit asserts (or deasserts, if explicitly stated or indicated by context) the signal on a signal line coupled between the signal driving and signal receiving circuits. A signal line is said to be "activated" when a signal is asserted on the signal line, and "deactivated" when the signal is deasserted. Additionally, the prefix symbol "/" attached to signal names indicates that the signal is an active low signal (i.e., the asserted state is a logic low state). A line over a signal name (e.g., '$\overline{\text{<signalname>}}$') is also used to indicate an active low signal. Active low signals may be changed to active high signals and vice-versa as is generally known in the art.

In embodiments of the present invention, row and column parity values that correspond to rows and columns of CAM cells within a CAM device are used to detect and automatically correct soft errors. In one embodiment, a row parity bit is associated with each row of CAM cells, and a column parity bit is associated with each column of CAM cells. A scan controller within the CAM device systematically reads each row of CAM cells within a CAM array, generates a parity check bit based on the content of the row (i.e., the row value) and compares the parity check bit against the corresponding row parity bit. If the check bit and the row parity bit do not match, a parity error is signaled and the scan controller stores the address of the row in an error address register.

In addition to checking for row parity errors, the scan controller applies each row value to a column parity calculation to enable detection of column parity errors. In one embodiment, each row value is added to a partial column parity word in an excellent-OR operation such that, after all row values have been added, the partial column parity word represents an exclusive-OR combination of the content of all the rows within the CAM array, and each bit within the partial column parity word represents an exclusive-OR of all the bits within a corresponding column of the CAM array. Thus, after each completed scan of the CAM array (i.e., reading all rows of CAM cells and adding the row values to the partial column parity word), the partial column parity word constitutes a newly generated column parity word which may be compared with a previously stored column parity word to detect the presence of a column parity error. If a soft error has occurred within a given cell of the CAM array, the row address of the error (i.e., detected through row parity checking and stored in the error address register), and the bit position of the error (i.e., the column offset of the error detected through column parity checking) constitute row and column error coordinates that uniquely identify the bit in error. Accordingly, the row value containing the bit in error may be read, and the bit in error changed (e.g., complemented) to generate a corrected row value. The corrected row value may then be written back to the CAM array at the error address to clear the error.

In one embodiment of the invention, the total number of parity bits used to provide error detection and correction is N row parity bits plus M column parity bits, where N is the number of rows of storage to be error corrected, and M is the number of bits per row. By contrast, error correction codes typically require storage of $\log_2(M)$ bits per row such that the total number of error correction code bits to be stored is $N*\log_2(M)$. Considering a 1024 row×72 bit CAM array, as an example, such an error correction code scheme would require storage of $1024*\log_2(72)=7{,}168$ error correction code bits (i.e., after rounding $\log_2(72)$ up to 7). By contrast, embodiments of the present invention enable error correction for the same storage array using as few as 1024+72=1096 bits. The storage savings grows as the number of rows in the array increases. Note that for other embodiments, each row of storage in the CAM array may use more than one row parity bit and/or each column of storage in the CAM array may use more than one column parity bit.

FIG. 1 illustrates a CAM device 100 according to an embodiment of the present invention. The CAM device includes a CAM array 101, address circuit 103, instruction decoder 105, scan controller 107, flag circuit 112, priority encoder 114, comparand register 115 and read/write circuit 161. Instructions, addresses and comparands (i.e., search values) are received in the CAM device 100 via interfaces to an instruction bus (IBUS) 145, address bus (ABUS) 141 and comparand bus (CBUS) 143, respectively. Each of the buses is preferably a multi-conductor signal path coupled to at least one host device, such as a general purpose processor, digital signal processor, network processor, application specific integrated circuit (ASIC) or other instruction issuing device. In alternative embodiments, one or more of the buses may be eliminated and the corresponding signals time-multiplexed onto another of the buses.

The CAM array 101 includes a plurality of CAM cells arranged in rows for storing CAM words. In one embodiment, each row of CAM cells includes at least one validity cell to store a value that indicates whether the row contains a valid CAM word. Each such value is referred to herein as a validity bit, though more than one bit may be used to indicate whether a given row of CAM cells contains a valid entry. Also, additional bits may be stored within each row to enable per-row control of search and row access operations. The CAM array 101 is coupled to (i.e., connected directly to or through one or more intervening circuits) the address circuit 103, priority encoder 114, flag circuit 112, comparand register 115, and read/write circuit 161. The comparand register 115 is used to store a comparand received via the comparand bus 143, and outputs respective bits of the comparand value onto corresponding comparand lines of the CAM array 101. In alternative embodiments, the comparand register 115 may be omitted and the comparand applied directly to comparand lines from the comparand bus 143. During a compare operation, the comparand may be masked by a global mask value (not shown), then compared simultaneously with all the CAM words stored in the CAM array 101. Each of the rows of CAM cells is coupled to a corresponding match line 182, and any match between the comparand and a valid CAM word results in the corresponding match line 182 being driven (or left charged or discharged) to a match state to signal the match condition to the priority encoder 114 and flag circuit 112. In an embodiment that includes validity cells, each validity bit that indicates an empty condition (i.e., no valid value stored in the row) prevents a match from being signaled on the corresponding match line, for example, by discharging the match line or otherwise driving the match line to a mismatch state.

When a match condition is signaled on one or more of the match lines 182, the priority encoder 114 determines a highest priority one of the match signals and outputs a corresponding CAM index 174 (i.e., address of the CAM word that generated the highest priority match signal). The flag circuit 112 also receives the match signals on match lines 182, and asserts a match flag 176 (i.e., a match signal) to indicate that a match has been detected. If more than one match is signaled on match lines 182, the flag circuit 112 may additionally assert a multiple-match flag to indicate that multiple matches have been detected.

The instruction decoder 105 includes decode circuitry to decode incoming instructions, and control circuitry to respond to the decoded instructions by issuing control and timing signals to other circuit blocks within the CAM device 100. The instruction decoder 105 may be implemented, for example, by a state machine that transitions from state to state in response to transitions of a clock signal (not shown), and incoming instructions and signals received from other circuit blocks within the CAM device 100. In an alternative implementation, the instruction decoder 105 is a lookup table or read only memory (ROM).

During a read or write access to the CAM array 101, the instruction decoder 105 outputs a select signal 118 (SEL) to the address circuit to select a read or write address source. Addresses may be supplied, for example, from the address bus 141, the scan controller 107 or from other registers within the CAM device (e.g., next free address register which contains an address of an empty row within the CAM array, a highest priority match register which contains an address of a row within the CAM array that yielded a highest priority match with a comparand value, etc.). The address circuit 103 receives an address from the selected address source and decodes the address to activate a corresponding word line 181. Each word line 181 is coupled to a corresponding row of CAM cells within the CAM array 101 and, when activated, enables a CAM word to be read from or written to the row.

The scan controller 107 is provided to detect and correct errors in the CAM array 101 under control of the instruction decoder 105. In one embodiment, the scan controller 107 outputs a predetermined sequence of scan addresses to the address circuit 103 to systematically read rows of the CAM array 101 for error detection purposes; an operation referred to herein as error scanning. The instruction decoder 105 may suspend error scanning from time to time, for example, to execute a host-requested write or read access to the CAM array 101. In the embodiment of FIG. 1, the instruction decoder 105 outputs one or more control signals 135 (CTL) to the scan controller 107 to selectively enable and disable error scanning, and to notify the scan controller 107 when a write access to the CAM array is to be performed.

The scan controller 107 is additionally coupled to the address circuit 103 and read/write circuit 161. During error scanning, the scan controller 107 outputs a systematic sequence of scan addresses (SA) to the address circuit 103 via path 144. The select signal 118 from the instruction decoder 105 selects the scan controller 107 as the address source, and each scan address is decoded by the address circuit 103 to activate a corresponding one of the word lines 181. The read/write circuit is set to a read mode by the instruction decoder 105 and senses the row value within the scan-address-selected row of the CAM array 101 (i.e., the row of CAM cells coupled to the activated word line). The row value is output by the read/write circuit 161 to the scan controller 107 which checks for a row parity error and updates the column parity calculation. In one embodiment, when a row parity error is detected, the scan controller 107 asserts an error signal 132 (EFLAG) and outputs the scan address as an error address (EADDR). The error signal 132 and error address 131 may be recorded in a device status register, output to another device (e.g., network processor or host processor), or used for other purposes. For example, the error address 131 may be compared with each search-generated index 174 to determine whether the index has resulted from a match between the comparand and a corrupted CAM word. In the embodiment of FIG. 1, the scan controller 107 is coupled to a write driver bank within the read/write circuit 161 to enable a corrected row value to be written back to the CAM array at the completion of an error scan cycle. This operation is discussed below in greater detail.

Figure 2:
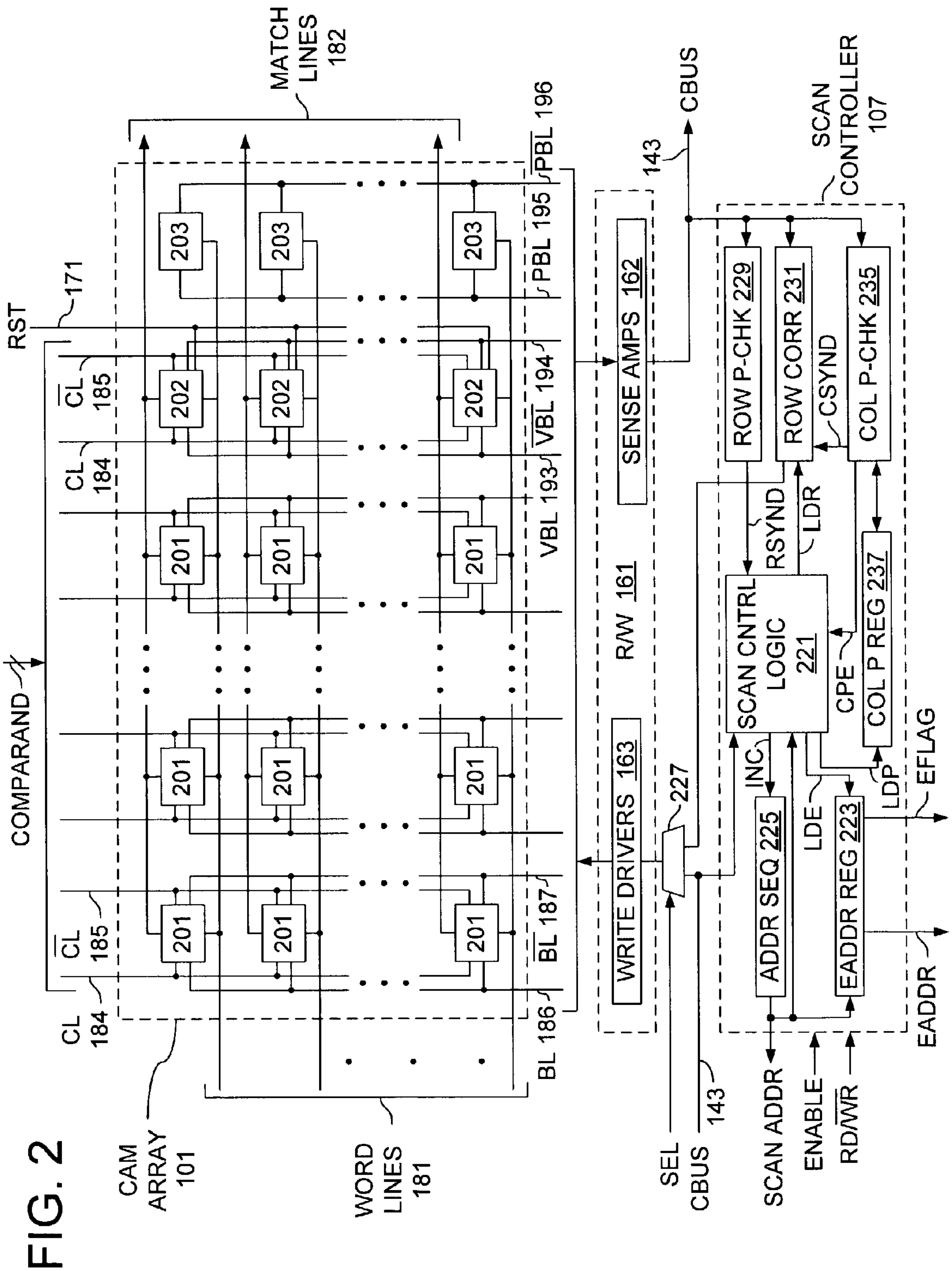
FIG. 2 illustrates an embodiment of the CAM array, read/write circuit and scan controller of FIG. 1.

FIG. 2 illustrates exemplary embodiments of the CAM array 101, read write circuit 161 and scan controller 107 of FIG. 1. The CAM array 101 includes a plurality of CAM cells 201 arranged in rows and columns. Each row of the CAM cells 201 is coupled to a respective word line 181 and match line 182, and each column of CAM cells is coupled to a respective pair of comparand lines 184 and 185 (CL and /CL) and bit lines 186 and 187 (BL and /BL). During a compare operation, comparand data is driven differentially onto the pairs of comparand lines so that the CAM cells within a given column each receive complementary signals that correspond to a bit of the comparand. In one embodiment, each CAM cell 201 includes a compare circuit, data storage element and, optionally, a mask storage element (e.g., for a ternary CAM cell). The compare circuit compares the incoming comparand bit to a value stored in the data storage element and affects the state of the corresponding match line 182 according to whether the comparand bit matches the stored value. For example, in one embodiment, each of the match lines 182 is initially pulled up to a logic high level to indicate a match condition. During a compare operation, each match line 182 is pulled low (i.e., discharged) by any CAM cells coupled to the match line that detect a mismatch condition. This arrangement constitutes a NOR-based CAM array. In alternative embodiments, other types of CAM arrays, such as NAND-based CAM arrays, may be used.

In a ternary CAM embodiment, each of the CAM cells 201 includes a mask storage element to store a mask bit. The mask bit is supplied to the comparator circuit to selectively mask (i.e., according to the state of the mask bit) the detection of a mismatch condition or at least prevent the CAM cell 201 from affecting the state of the match line 182. The mask values stored within a row of CAM cells form a CAM word referred to herein as a mask word. The mask word may be treated as a separate dedicated row for parity checking purposes, or as a logical extension of the data word stored within the data storage elements.

The CAM array 101 also includes a column of validity cells 202 and a column of row parity cells 203. The validity cells 202 operate in generally the same manner as the CAM cells 201 to compare a stored validity bit with a validity-check bit applied on comparand lines 184 and 185 (CL and /CL) and to affect the state of the match line 182 for the corresponding row. In one embodiment, the validity-check bit has a state that corresponds to a valid row entry so that, if the validity-check bit matches the content of a given validity cell 202, match indication is enabled (or not suppressed) on the corresponding match line. That is, a match may be signaled on the match line if the comparand value otherwise matches the contents of the corresponding row of CAM cells 201. If the validity-check bit does not match the content of a validity cell, match indication is disabled on the corresponding match line, thereby preventing false match indications that might otherwise result from comparison of a comparand and invalid CMA word. The comparand lines coupled to the column of validity cells may be driven by predetermined voltage sources (e.g., a supply voltage and ground voltage) rather than comparand data. Also, in the embodiment of FIG. 2, a reset line 171 is provided to reset the validity bit for each row (i.e., to indicate an invalid or empty state within the row) at initialization time. In alternative embodiments, the validity cells may be omitted from the CAM array.

In one embodiment, the row parity cells 203 do not participate in compare operations, but rather are storage elements for storing row parity values that reflect the row parity of the corresponding rows of the CAM array 101. In one embodiment, referred to herein as a modulo-sum embodiment, row parity equates to a modulo-2 sum of bits stored within a given row of CAM cells and, optionally, the corresponding validity cell. Thus, if a given row contains an odd number of 1's, the row parity value is a 1. If the row contains an even number of 1's, the row parity value is a 0. In an alternative embodiment, the row parity may be a modulo-2 count of the number of 0's stored within the row such that, if the row contains an odd number of 0's, the row parity value is a 1, and if the row contains an even number of 0's, the row parity value is a 0. Although embodiments are described below as implementing the modulo-sum embodiment, any type of parity calculation may be used without departing from the scope of the present invention. As discussed below, the row parity value may be generated within the CAM device as part of an array write operation or supplied by a host device as part of a data write request.

The read/write circuit 161 includes a bank of write drivers 163 for writing to the CAM array 101, and a bank of sense amplifiers 162 for reading from the CAM array 101. In the embodiment of FIG. 2, the CAM array 101 includes a plurality of bit line pairs 186, 187 (BL and /BL) coupled to respective columns of CAM cells 201 within the CAM array 101. The bit lines constitute an access port for storing data in and retrieving data from a selected row of CAM cells (i.e., row of CAM cells coupled to an activated word line). A pair of validity bit lines 193, 194 (VBL and /VBL) are similarly coupled to the column of validity cells 202, and a pair of parity bit lines 195, 196 (PBL and /PBL) are coupled to the column of parity cells 203 to enable write and read access to those cells. During a write operation, the write driver bank 163 is enabled to drive a CAM word (received, for example, from the comparand bus 143 and which may include data and/or mask information) onto the bit lines (186, 187), and a corresponding validity bit and row parity bit onto the validity bit lines (193,194) and parity bit lines (195,196), respectively. The overall write data value (i.e., CAM word, validity bit and row parity bit) is then stored within the row of cells coupled to the address-selected (i.e., activated) word line. During a read operation, an address-selected row of the CAM array 101 is enabled to output a row value (e.g., CAM word, validity bit, and row parity bit) onto the various bit lines (i.e., 186, 187, 193, 194, 195 and 196). The sense amplifier bank 162 senses and amplifies the row value, and outputs the row value, for example, to the comparand bus 143 and to the scan controller 107.

The scan controller 107 includes scan control logic 221, scan address sequencer 225, error address register 223, column parity register 237, column parity checker 235, row parity checker 229 and row correction circuit 231. In one embodiment, the scan control logic 221 is a state machine that responds to enable and read/write signals from an instruction decoder to carry out error scanning and correction operations. The scan address sequencer 225 maintains a scan address value and increments the scan address through a systemic scan sequence in response to an increment signal from the scan control logic 221. In one embodiment, the scan address is incremented by one from the lowest address to the highest address of the CAM array. In other embodiments, the scan address may be incremented by amounts other than one (including a negative amount to achieve a down count) and the scan sequence may be started or ended at addresses other than the lowest and highest address. In any case, after the scan address sequencer 225 reaches a final address in the scan sequence, the error scan cycle is concluded and the scan address is reset (or rolls over) to a starting address within the sequence.

For each scan address in the scan sequence, the corresponding row value is read from the CAM array by the read/write circuit 161 and input to the row parity checker 229. The row parity checker 229 generates a row parity-check value, compares the row parity-check value with the stored parity value for the row (i.e., the row parity value read from the row parity cell 203), and signals a row parity error to the scan control logic 221 if the generated and stored row parity values do not match. In one embodiment, the row parity checker 229 includes a bank of exclusive-OR gates to generate the row-parity check value (e.g., by modulo-2 summation of all the bits within the row value), and an exclusive-OR gate to generate a row parity error indicator by modulo-2 summation of the row parity-check value and the row value. Because the row parity-check value and the row parity value are generated by the same logical combination of the constituent bits of the row value, the modulo-2 sum (i.e., exclusive-OR combination) of the row parity-check value and the row parity value will be nonzero in the event of a single bit error (or an odd number of bit errors) within the row and zero if there are no bit errors (or possibly multiple bit errors that yield the same modulo-2 sum as in the absence of bit errors). Accordingly, by exclusive-ORing all the bits of the row value with one another and with the row parity value, a type of row parity error indicator referred to herein as a row syndrome (RSYND) is generated; the row syndrome being nonzero in the event of a parity error and zero in absence of a parity error. The row syndrome is supplied to the scan control logic 221. If the row syndrome indicates an error (e.g., RSYND is high), the scan control logic 221 outputs a load signal (LDE) to the error address register 223 to enable the scan address from the scan address sequencer 225 to be loaded into the error address register 223, and outputs a load signal (LDR) to the row correction circuit 231 to store the corrupted row value in a row correction register within the row correction circuit. Alternatively, the corrected row value may be read in a second read operation from the CAM array 101 instead of being stored in the row correction register. In one embodiment, the scan control logic 221 also increments an internally maintained count value in response to the row parity error indication to keep track of the number of row parity errors detected during a given error scan cycle. In alternative embodiments, the number of row parity errors detected during an error scan cycle is determined by the number of entries in the error address register 223.

In addition to being checked for row parity errors, each row value read during an error scan cycle is input to the column parity checker 235 where it is included in a running column parity word calculation. In one embodiment, the column parity checker 235 includes a partial column parity register to store the partial column parity word (i.e., intermediate sum of row values), and a bank of exclusive-OR gates to update the partial column parity word in response to each incoming row value. The partial column parity word is zeroed at the beginning of each error scan cycle, then exclusive-ORred with each incoming row value in succession by the bank of exclusive-OR gates. The application of each incoming row value to the column parity word calculation yields an updated partial column parity word which is loaded into the partial column parity register, overwriting the previous value.

When the final row value of an error scan cycle is applied to the column parity word calculation, the resulting partial column parity word constitutes a newly generated column parity word which is compared with the previously generated column parity word stored within the column parity register 237. If the newly generated column parity word does not match the previously stored column parity word, the column parity checks 235 outputs a column parity error signal (CPE) to the scan control logic 221 to signal an error condition. In one embodiment, the column parity checker generates a column syndrome value (CSYND) by exclusive-ORing the generated and stored column parity values and outputs the column syndrome to the row correction circuit 231. The row correction circuit 231 combines the column syndrome value with the corrupted row value (i.e., stored in the row correction register) in an exclusive-OR operation to generate a corrected row value. The corrected row value is output to a mutliplexer 227 which, during a row correction operation, selects the corrected row value to be a write data value. The error address register 223 is selected (e.g., by the address circuit 103 of FIG. 1) to source the write address during the row correction operation so that the corrected row value is written to the row address from which the corrupted row value was read.

Figure 3:
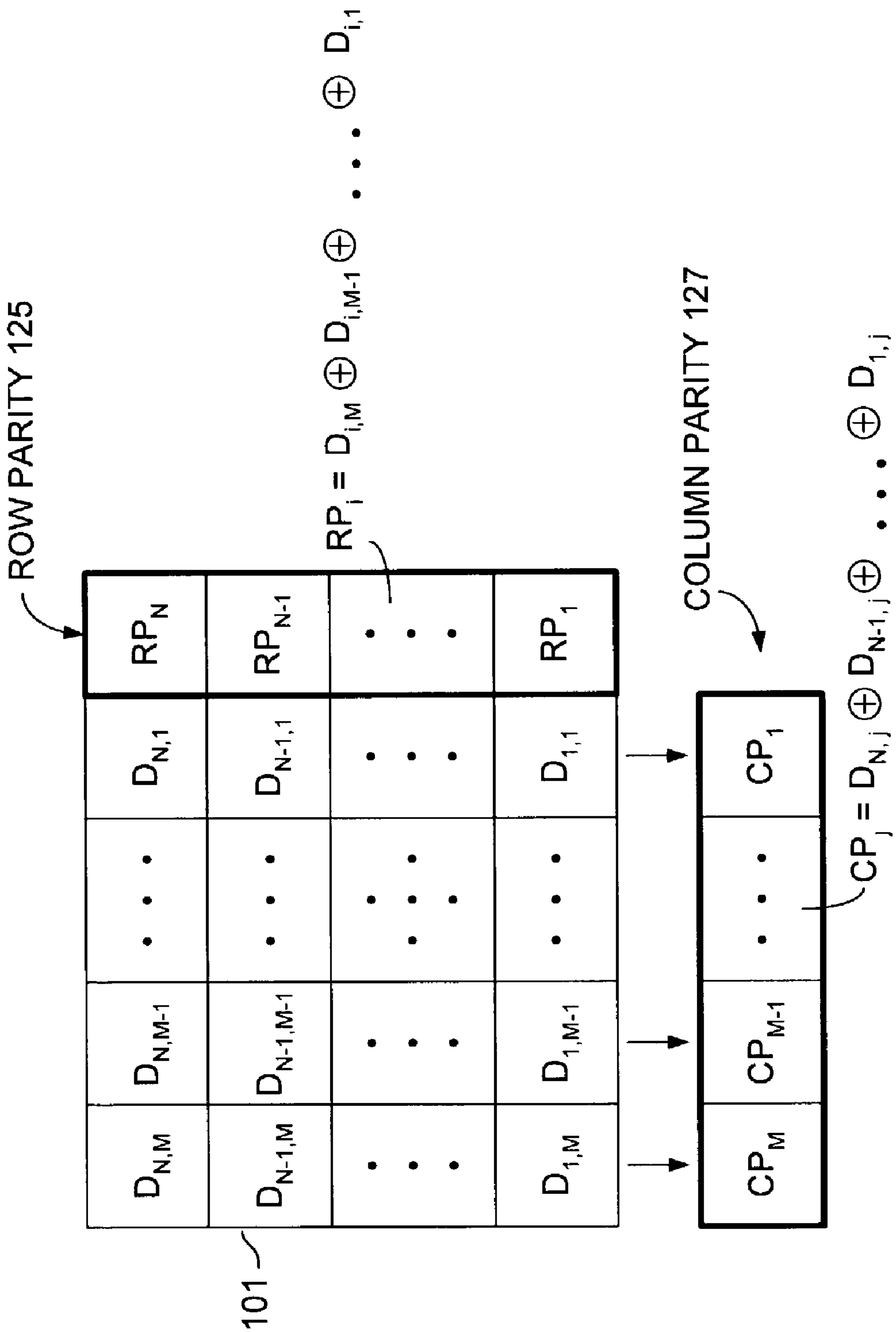
FIG. 3 illustrates the logical relationship between the contents of the CAM array and row and column parity values.

FIG. 3 illustrates the logical relationship between the contents of the CAM array 101 and the row and column parity values. As shown, the CAM array 101 includes N rows and M columns, and each CAM cell has a unique row and column coordinate (i, j). Accordingly, the data value (or mask value) at a given location within the CAM array may be expressed as $D_{i,j}$, and the row and column parity values that correspond to the data value may be expressed as $RP_i$ and $CP_j$, respectively. Using this notation, the row parity value for a given row, i, of the CAM array 101 may be generated by exclusive-ORing (i.e., modulo-2 summation) of each data value within the row (i.e., $RP_i=D_{i,M}\oplus D_{i,M-1}\oplus \ldots \oplus D_{i,1}$) and the column parity value for a given column, j, may be generated by exclusive-ORing of each data value within the column (i.e., $CP_j=D_{N,j}\oplus D_{N-1,j}\oplus \ldots \oplus D_{1,j}$). Thus, in the embodiment of FIG. 2, in which the CAM array 101 is structured to enable rows to be read one at a time, the column parity word that includes the column parity values as constituent bits (i.e., CP[M:1]) may be generated by reading each row value in succession and exclusive-ORing the row value with a running total. That is:

$CP[M:1]=RV[N]\oplus RV[N-1]\oplus \ldots \oplus RV[1]$, where RV is a given row value and each exclusive-OR operation is a bit-wise exclusive-OR operation between the respective data values within the rows. That is:

$RV[i]\oplus RV[i-1]=D[i, M]\oplus D[i-1,M], D[i, M-1]\oplus D[i-1,M-1], \ldots, D[i, 1]\oplus D[i-1,1]$ As discussed above, different types of parity calculations may be used in alternative embodiments.

Figure 4:
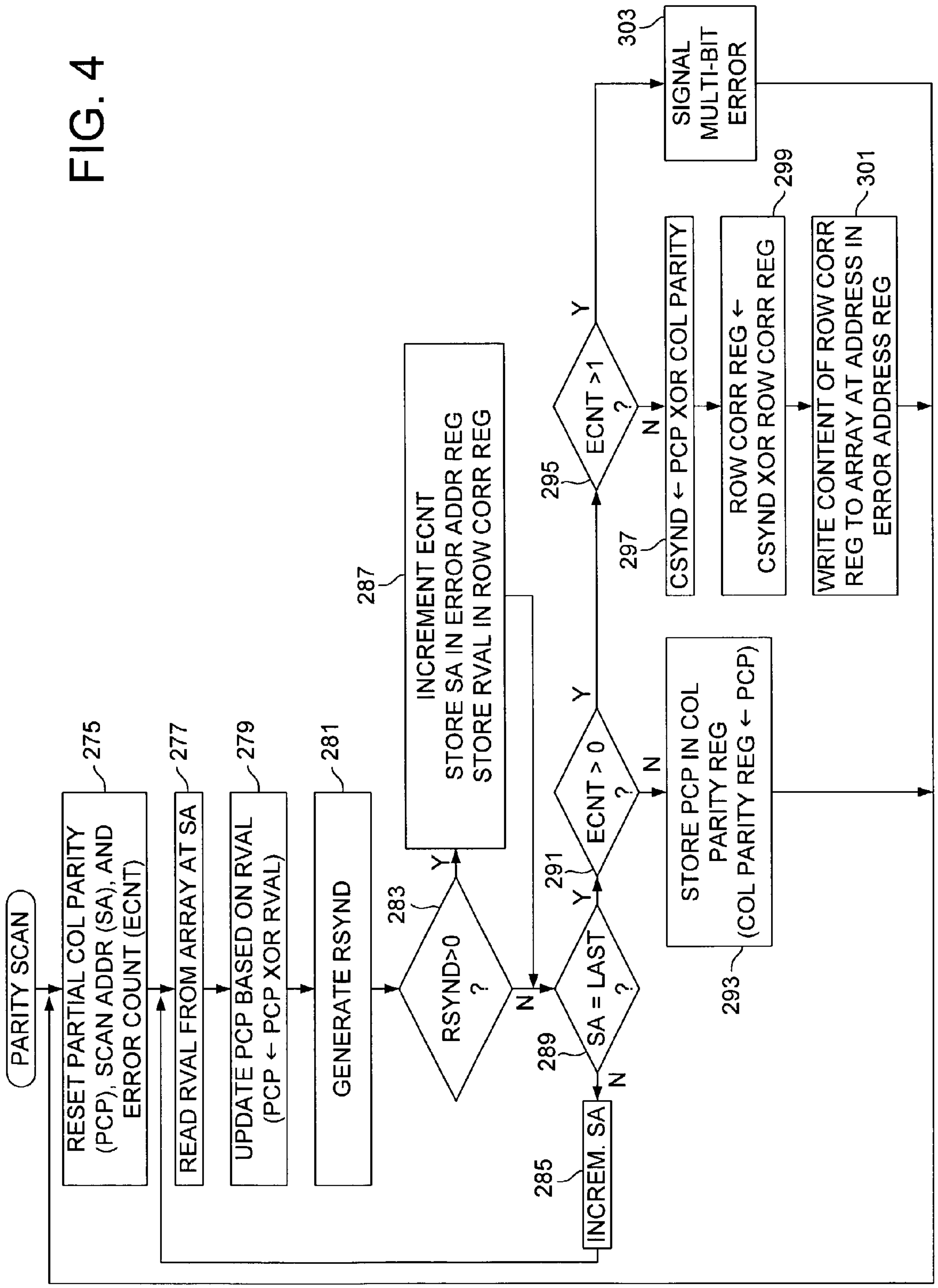
FIG. 4 illustrates an error scan cycle according to an embodiment of the invention.

FIG. 4 illustrates an error scan cycle according to one embodiment. At the start of the cycle (275), the partial column parity word (PCP) maintained within the column parity checker 235 of FIG. 2 is reset to zero; the scan address (SA) is reset to the starting address of the scan sequence, and an error count value (ECNT) maintained within the scan control logic 221 of FIG. 2 is reset to zero. At 277, a row value (RVAL) is read from the CAM array at the scan address. At 279, the partial column parity word is exclusive-ORed with the row value to generate an updated partial column parity word. At 281, a row syndrome is generated by exclusive-ORing the bits of the row value with one another and with the row parity value as described in reference to FIG. 2. If the row syndrome is nonzero (determined at 283), a row parity error has been detected. Accordingly, at 287 the error count value is incremented to record the row parity error, the scan address is stored within the error address register to mark the row-location of the error, and the corrupted row value is stored within the row correction circuit.

At this point, a row check operation of the error scan cycle is completed. If the scan address is not the final scan address within the scan sequence (i.e., determined at 289), the scan address is incremented (or decremented) and a row check operation is performed on the next address in the scan sequence starting at 277.

If, at 289, the scan address is determined to be the final address of the scan sequence, then the error count value indicates the number of row errors detected during the sequence of row check cycles, and the partial column parity word constitutes a newly generated column parity word (i.e., generated in the manner described in reference to FIG. 3). Accordingly, at 291, the error count is evaluated to determine whether any row parity errors have been detected. If no row parity errors have been detected, then the newly generated column parity value is stored in the column parity register at 293 and the error scan cycle is completed. Note that storing the newly generated column parity value corrects any soft errors that may have occurred within the column parity register itself.

If a row parity error has been detected, then the error count is evaluated at 295 to determine whether more than one row parity error has been detected. If more than one row parity error has been detected (i.e., error count greater than one), then more than one bit error has occurred, and a multi-bit error is signaled by the scan controller at 303, for example, by setting a status value within a status register of the CAM device, and/or outputting an error signal to a processor or other device.

If the error count is determined at 295 not to be greater than one, then a single-bit parity error has occurred and the corrupted row value stored within the row correction circuit and the newly generated column parity word are used to generate a corrected row value. More specifically, at 297, the newly generated column parity word (PCP) is exclusive-ORed, bit for bit, with the column parity word stored within the column parity register (i.e., the column parity word generated during the previous scan cycle) to generate a column syndrome value (CSYND). Assuming that no errors have occurred within the stored column parity word and that the row parity error was not caused by an error within a row parity cell, an exclusive OR combination of the newly generated column parity word and the stored column parity word will yield a column syndrome value in which all the constituent bits are zero except the bit that corresponds to the column that produced the column parity error. Accordingly, at 299, the column syndrome is exclusive-ORed with the corrupted row value within the row correction circuit to complement the bit in error, restoring the bit to its proper state and thereby generating a corrected row value. At 301 the corrected row value is written to the CAM array at the address indicated by the scan address stored within the error address register, overwriting the corrupted row value.

Referring briefly to FIGS. 2 and 3, it should be noted that a soft error may occur in the row parity cells themselves. In one embodiment the read/write circuit (e.g., element 161 of FIG. 2) generates a row parity value for the corrected row value as part of the write operation in 301 so that the row parity value is overwritten along with the corrected row. Consequently, a row parity error caused by a flipped bit in a row parity cell will be corrected by the write-back at 301. Note that, when a row parity cell is the source of error and no error has occurred within the CAM cells or validity cells, a row parity error is detected, but no column parity error is detected. Consequently, a zero-valued column syndrome will be generated at 297 and exclusive-ORed with the row value stored within the row correction circuit, thereby yielding the same row value read from the error address, but without the row parity value. When the row value is written back to the error address (i.e., the scan address within the error address register), the row parity value generated during the write operation will overwrite the corrupted row parity value, thereby correcting the source of the row parity error.

In an alternative embodiment, the row parity values themselves may be included in the column parity word calculation, thereby enabling detection of an error within the column of row parity cells and generation of a row-parity-correcting column syndrome value. The column syndrome value may then be exclusive-ORed with the row value (including the row parity value) within the row correction circuit to correct an error either in the data/mask/validity portion of the row value or the row parity bit of the row value. This embodiment is particularly useful in a CAM device that does not otherwise require row parity generation circuitry in its read/write circuit (e.g., row parity values are provided from an external source during host-requested data write operations).

Figures 5, 6A, 6B, 6C, 7A, 7B, 7C, 8A, 8B, 8C:
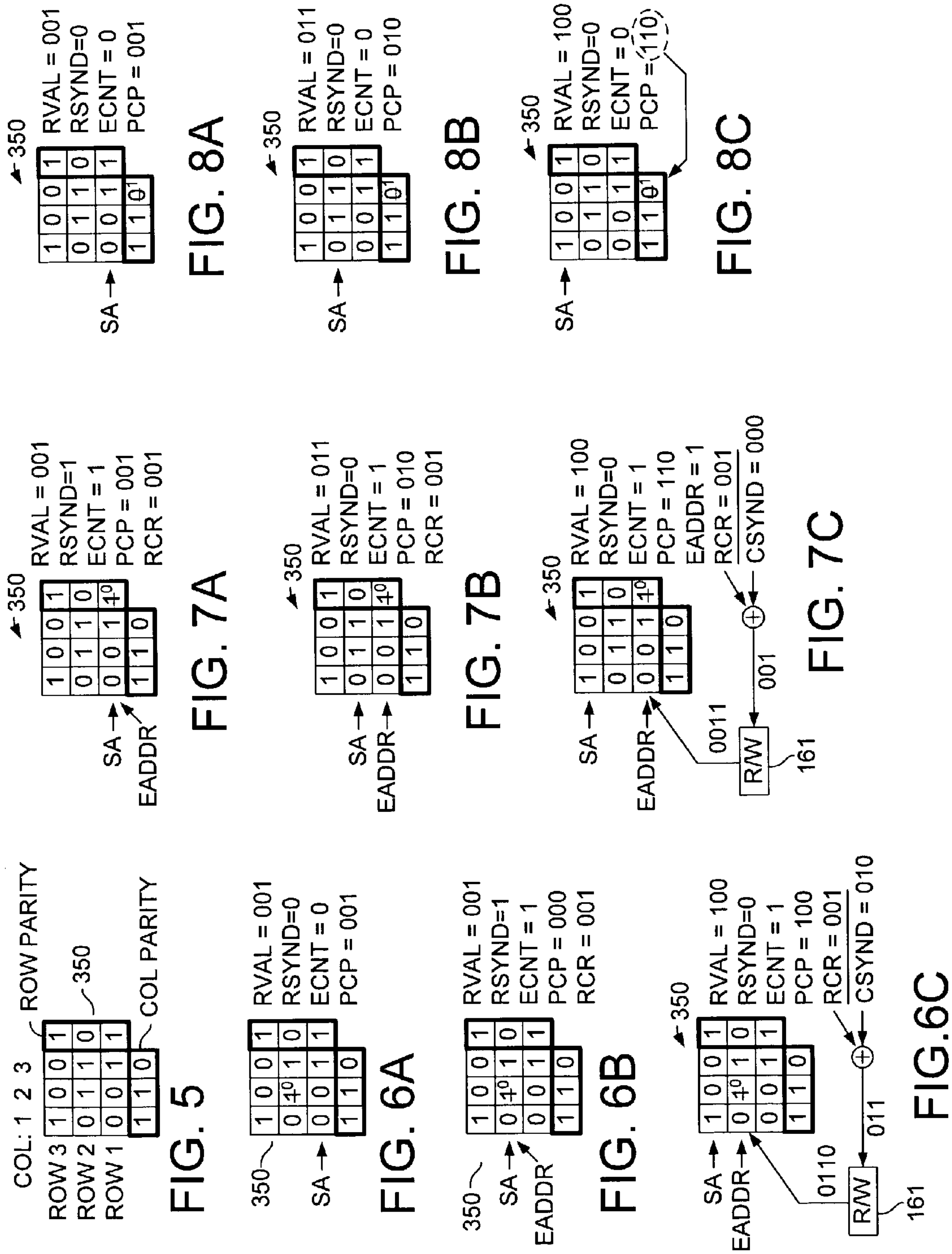
FIG. 5 illustrates a CAM array for which row and column parity values are maintained using the error scan cycle described in reference to FIG. 4.
FIGS. 6A–6C illustrate an exemplary error detection and correction operation within the CAM array of FIG. 5.
FIGS. 7A–7C illustrate another exemplary error detection and correction operation within the CAM array of FIG. 5.
FIGS. 8A–8C illustrate another exemplary error detection and correction operation within the CAM array of FIG. 5.

FIG. 5 illustrates a CAM array 350 including CAM cells arranged in three rows and three columns and for which row and column parity values are maintained using the error scan cycle described in reference to FIG. 4. Note that a given column of the CAM array may include validity cells rather than CAM cells, and that the values maintained within the CAM cells may contain data or mask values. Also, though the column parity word is depicted as including only three constituent column parity bits (i.e., corresponding to the three columns of the CAM array), the column parity value may additionally include a column parity bit that corresponds to the column of row parity values.

FIGS. 6A–6C illustrate an exemplary error detection and correction operation within the CAM array 350 accomplished through the error scan cycle described in reference to FIG. 4. Referring to FIG. 6A, an error has occurred in the second column of the second row of the CAM array 350. The bit stored at that location has been flipped from a 1 to a zero, as indicated by the strikethrough and superscript notation. The scan address (SA) is presently pointed at the first row of the CAM array such that the row value read from the array (RVAL) is 001; the row syndrome (RSYND) is 0, thus indicating no row parity error in the first row; the error count (ECNT) is zero; and the partial column parity word (PCP) is 001, the result of exclusive-ORing the content of the first row (001) with a reset column parity word (000). FIG. 6B depicts the status of the error scan cycle after the scan address has been incremented and a row check operation has been performed on the second row. That is, the row value is 001; the row syndrome is 1, indicating a row parity error; the error count has been incremented to reflect the row parity error; the partial column parity word is 000, the result of exclusive-ORing the previous partial column parity word and the present row value (i.e., $001\oplus001=000$); the row value (001) has been stored in a row correction register (RCR) within the row correction circuit; and the scan address has been loaded into the error address register such that an error address (EADDR) now points to the second row of the CAM array 350. FIG. 6C depicts the status of the error scan cycle after the scan address has been incremented again and a row check operation has been performed on the third row. The row value now reflects the content of the third row, 100; the row syndrome is zero, indicating that no row parity error has been detected in the third row; the error count remains at one; and the partial column parity word is now 100, reflecting the overall column parity calculation, $001\oplus001\oplus100$. The error address remains pointed at row two of the CAM array 350, and the corrupted value 001 remains present in the row correction register. Because all the row check operations have been completed, the partial column parity word now reflects a newly generated column parity word. The newly generated column parity word is exclusive-ORed with the stored column parity word (110) to produce a column syndrome (CSYND) of 010 (i.e., $100\oplus110=010$), a value having a set bit in the bit position (i.e., column offset) that corresponds to the column of the CAM array 350 containing the error. As illustrated diagrammatically in FIG. 6C, the column syndrome is exclusive-ORed with the content of the row correction register (i.e., the corrupted row value, 001) to generate a corrected row value. 011. The corrected row value is then supplied to the read/write circuit 161 which generates a row parity value (i.e., $0\oplus1\oplus1=0$) and stores the second row value and the row parity value in the CAM array 350 at the row indicated by the error address. At this point the error scan cycle is complete and the CAM array has been restored to an error free condition. The error address register is cleared and the parity scan cycle is repeated.

FIGS. 7A–7C illustrate another exemplary error detection and correction operation within the CAM array 350 accomplished through the error scan cycle described in reference to FIG. 4. In this example, an error has occurred within the row parity cell of row one, the correct row parity value, 1, having been flipped to a 0. FIG. 7A illustrates the state of scan controller after completion of a row check operation at row one. That is, the row value read from the CAM array 350 is 001; the row syndrome is 1, indicating a row parity error; the error count value has been incremented to reflect the row parity error detection; the scan address has been loaded into the error address register such that an error address now points to row one of the CAM array 350; the partial column parity word is 001 to reflect the column parity contribution of the row value, and the row correction register has been loaded with the row value for which the parity error was detected. FIG. 7B illustrates the state of the scan controller after completion of the row check operation at row two of the CAM array 350. The row value reflects the content of row two; the row syndrome is zero, indicating no row parity error detection in row two; and, consequently, the error count and row correction register content remain unchanged. The row value from row two has been applied to the partial column parity calculation, yielding a partial column parity word of $001\oplus011=010$. FIG. 7C illustrates the state of the scan controller after completion of the row check operation at row three of the CAM array 350. The row value reflects the content of row three; the row syndrome is zero (no row parity error in row three); the error count and row content register content remain unchanged. The row value from row three has been applied to the partial column parity calculation, yielding a partial column parity word of $010\oplus100=110$. Because all the row check operations have been completed, the partial column parity word constitutes a newly generated column parity word that is exclusive-ORed with the stored column parity word to generate a column syndrome (CSYND) of $110\oplus110=000$, a value indicating that no column parity error was detected. Because a row parity error was detected, but no column parity error, it may be inferred that the row parity bit for row indicated by the error address is in error. In one embodiment, the scan controller operates in the same manner as in the case of a column parity error; exclusive-ORing the column syndrome with the content of the row correction register to generate a row value to be written back to the CAM array at the error address. Because the read/write circuit regenerates the row parity value based on the putatively corrected row value, a corrected row parity value (i.e., $0\oplus0\oplus1=1$) is generated and stored with the row value, thereby correcting the row parity error.

Referring to FIGS. 7A–7C, in an alternative embodiment, an additional column parity bit may be included within the column parity word for the column of row parity cells. In that case, the newly generated column parity word in FIG. 7C would be $0010\oplus0110\oplus1001=1001$, while the stored column parity word (generated during a previous parity scan cycle) would be $0011\oplus0110\oplus1001=1100$, thus yielding a column syndrome of 0001; a value that indicates the presence of an error in the column of row parity cells. Thus, in such an embodiment, the row parity generator within the read/write circuit is not needed to correct the parity error (and may be omitted if not needed to generate a row parity during a write operation). Instead, the column syndrome may be applied to the row value (now including the row parity value) within the row correction register to generate a row value and corrected row parity value that may be written back to the CAM array at the error address to clear the row parity error.

FIGS. 8A–8C illustrate yet another exemplary error detection and correction operation within the CAM array 350 accomplished through the error scan cycle described in reference to FIG. 4. In this example, an error has occurred within the column parity word stored in the column parity register; bit three of the column parity word has been flipped from a 0 to a 1. FIG. 8A illustrates the state of scan controller after completion of a row check operation at row one. The row value read from the CAM array is 001; the row syndrome is 0 (no row parity error); the error count value is zero; and the partial column parity word is 001 to reflect the parity contribution of the row value (i.e., 000⊕001=001). Referring to FIG. 8B, after the second row operation, the scan controller state remains substantially unchanged, except that the row value and partial column parity words have been updated according to the row value read from row two. That is, no row parity error is detected within row two, so no error address is loaded into the error address register, no row value is loaded into the row correction register and the error count remains at zero. Similarly, as shown in FIG. 8C, the row syndrome is zero for the third and fourth row operation, so that the error address register and row correction register remain unloaded and the error count remains at zero. Because no row parity error has been detected, no write-back to the CAM array is required to correct a corrupted CAM word. Nevertheless, as shown in FIG. 8C, the stored column parity word is overwritten with the newly generated column parity word, clearing the column parity word error.

Note that the corrupted column parity word described in reference to FIGS. 8A–8C is corrected without being detected. In an alternative embodiment, the newly generated column parity word may be exclusive-ORed with the stored column parity word regardless of whether a row parity error was detected, thereby enabling detection of a corrupted column parity word. The corruption may then be logged within a status register of the CAM device and/or signaled to a host device to enable tracking of such errors for reliability evaluation, maintenance or other purposes.

Figure 9:
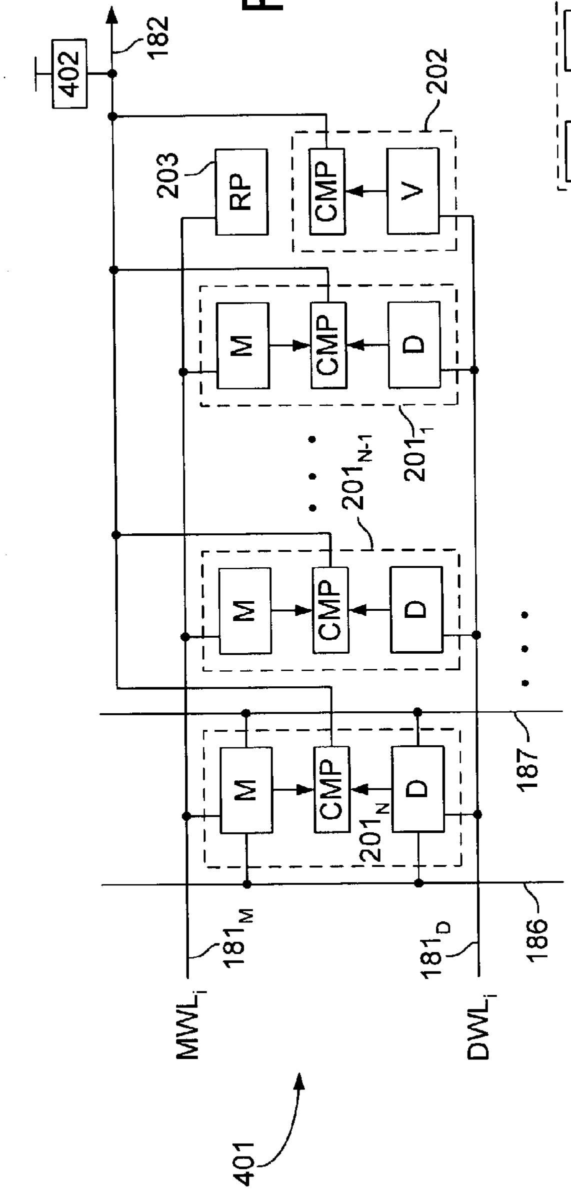
FIG. 9 illustrates an exemplary row of cells within a ternary CAM device.

FIG. 9 illustrates an exemplary row 401 of cells within a ternary CAM device in which embodiments of the present invention may be used. The row 401 includes N CAM cells $\mathbf{201}_N$–$\mathbf{201}_1$, a validity cell 202 and a parity cell 203. Each of the CAM cells 201 is a ternary CAM cell that includes a data storage element (D), mask storage element (M) and compare circuit (CMP). Though not shown, respective pairs of comparand lines are coupled to the compare circuits to supply comparand data for comparison with the data value within the data storage element. Depending on the comparison result and the state of the mask value within the mask storage element (which enables selective masking of mismatch conditions), the compare circuit outputs a match or mismatch signal on the match line 182. The validity cell 202 similarly compares a validity bit (stored within validity storage element, V) to a validity-check value to signal validity or invalidity of the match result. In the embodiment of FIG. 9, the match line 182 is precharged to a match indicating condition (e.g., a logic high level) by a precharge circuit 402. The compare circuits within the CAM cells 201 or validity cell 202 may then signal mismatch conditions by pulling the match line 182 low. Note that the validity bit itself may be used to affect the state of the match line (e.g., pulling the match line low to prevent a match indication) in an alternative embodiment, obviating the compare circuit (CMP) within the validity cell 202.

In the embodiment of FIG. 9, separate mask and data word lines $\mathbf{181}_M$ ($MWL_1$) and $\mathbf{181}_D$ ($DWL_i$), respectively, are used to enable read/write access to the data and mask storage elements within the CAM row (e.g., via bit lines 186 and 187). The parity cell 203 is coupled to the mask word line $\mathbf{181}_M$ and is therefore accessed (i.e., read or written) along with the mask storage elements, while the validity cell 202 is coupled to the data word line $\mathbf{181}_D$ and is accessed along with the data storage elements. The word line connections of parity cells 203 and the validity cell 202 may be reversed in alternative embodiments such that the parity cell is accessed with the data storage elements and the validity cell is accessed with the mask storage elements.

Figure 10:
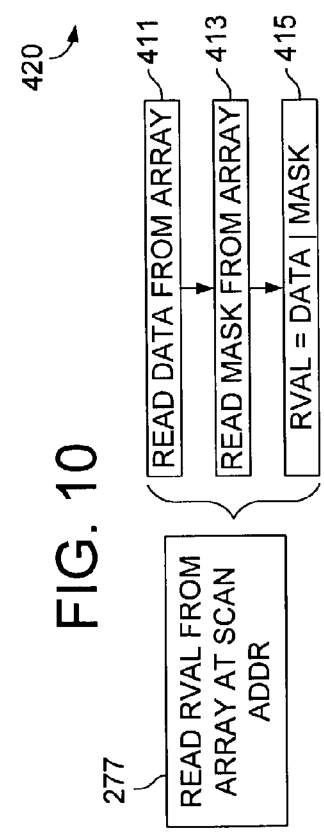
FIG. 10 illustrates mask read and data read operations that are used to retrieve a row value for parity checking purposes.

Because of the separate mask and data word lines, $\mathbf{181}_M$ and $\mathbf{181}_D$, reading a row value from row 401 for parity checking purposes involves two read accesses to the array. Referring to FIG. 10, for example, the row value read operation at block 277 of FIG. 4 is decomposed into a data read at the scan address to retrieve the data bits and validity bit (411), and a mask read at the scan address to retrieve the mask bits and parity bit (413). The data and mask values may be read in either order or, if additional bit lines are provided to enable simultaneous access to the data and mask storage cells (and the parity and validity cells), the data and mask values may be read concurrently. In either case, the data and mask components of the row value are concatenated to form the completed row value (415). The concatenation may be achieved by storing the values read at 411 and 413 in respective portions of a row value register or by storing the first value read (mask or data) while the second value read is supplied from the read/write circuit, the first and second values being provided in parallel (i.e., as the row value) to the row correction circuit, row parity checker and column parity checker. Also, if an error correction operation is performed, separate data and mask write operations (which may be carried out concurrently if separate sets of bit lines are provided for access to the data and mask storage elements) are used to write the content of the row correction register to the arrays at the error address indicated by the error address register. In an alternative embodiment, a shared word line may be used to enable access to both the mask and data storage elements.

Figure 11:
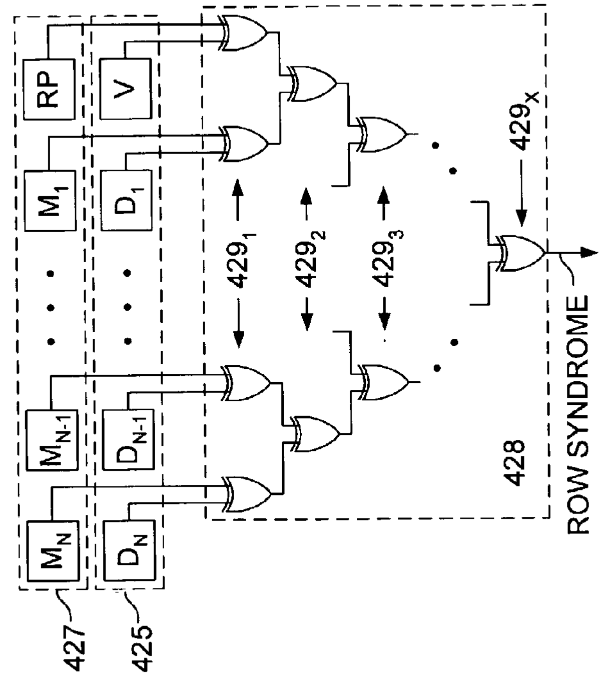
FIG. 11 illustrates an embodiment of a row syndrome generator.

FIG. 11 illustrates an embodiment of a row syndrome generator 420 that may be used to generate a row syndrome value based on values retrieved from the CAM array in separate data and mask reads from a given scan address. The row syndrome generator 420 includes a data register 425 to store data and validity bits read in a data read operation, a mask register 427 to store mask and row parity values read in a mask read operation, and a combinatorial logic circuit 428 to generate a modulo-2 sum (i.e., exclusive-OR) of the values within the data and mask registers. In the embodiment shown, the content of each bit of the data register 425 is exclusive-ORed with a corresponding bit from the mask register 427 by a first tier of exclusive-OR gates $\mathbf{429}_1$ within the logic circuit 428. The output of each exclusive-OR gate within the first tier $\mathbf{429}_1$ is supplied to a second tier of exclusive-OR gates $\mathbf{429}_2$ (there being half as many exclusive-OR gates in the second tier as in the first tier), the output of the second tier $429_2$ being supplied to a third tier of exclusive-OR gates and so forth to a final exclusive-OR gate $429_X$ that outputs the row syndrome. Thus, the logic circuit 428 generates a row syndrome according to the following expression:

$$\text{Row Syndrome} = (M_N \oplus M_{N-1} \oplus \ldots \oplus M_1 \oplus D_N \oplus D_{N-1} \oplus \ldots \oplus D_1 \oplus V) \oplus RP$$
$$= (RPC) \oplus RP, \text{ where } RPC \text{ is the row parity-check value.}$$

Accordingly, a nonzero row syndromic indicates a row parity error for the row value. Note that the logic circuit 428 may be implemented in alternative embodiments by any circuit (including a different combinatorial logic circuit, or a state machine, look-up table etc.) which generates a row syndrome result according to the above expression.

Because the column parity word is calculated based on a logical combination of all the rows of the CAM array (or, as discussed below, at least a logical subdivision of the CAM array), a write to the CAM array disrupts the coherency between the CAM array contents and the column parity word. The write operation may also disrupt the coherency between the CAM array contents and the partial column parity word, depending on whether the write address (i.e., the address to which the write operation is directed) has already been subjected to a row check operation within the current error scan cycle. In one embodiment, these complications are resolved by aborting the error scan cycle in progress in response to a host-requested a write operation. After the write operation is completed, the column parity word is registered based on the updated array contents and the error scan cycle is restarted at the beginning of the scan sequence. In an alternative embodiment, the error scan cycle in progress is temporarily halted (i.e., suspended) in response to a host-requested write operation, but not aborted. As part of the write operation, the column parity word is updated by removing the parity contribution of the row value to be overwritten (referred to herein as the target row value), and applying the parity contribution of the row value to be written (i.e., the write data). The partial column parity word is conditionally updated (i.e., by removing the parity contribution of the target row value to be overwritten and applying the parity contribution of the write data) depending on whether a row check operation has been executed at the write address in the current error scan cycle.

Figure 12:
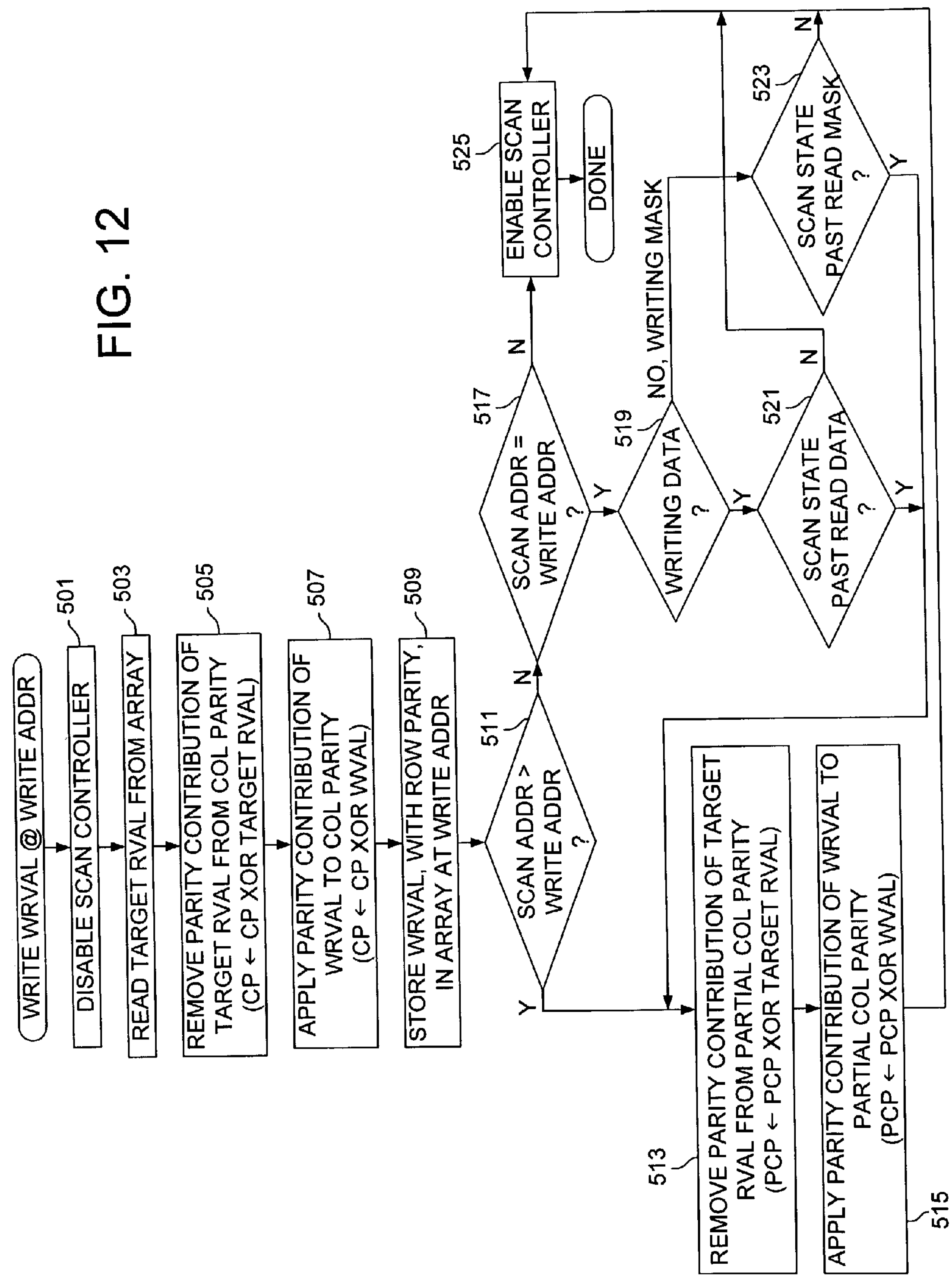
FIG. 12 illustrates a write operation in which a column parity word is updated, and a partial column parity word is conditionally updated, by removing the parity contribution of a target row value and applying the parity contribution of a write data value.

FIG. 12 illustrates a write operation (WRITE WRVAL@WRITE ADDR) in which the column parity word is updated, and the partial column parity word conditionally is updated, by removing the parity contribution of the target row value and applying the parity contribution of the write data. At 501, the scan controller is disabled, suspending the current error scan cycle and enabling the read/write port of the CAM array to be used for a host-requested write operation. Referring to the CAM array 101 of FIG. 2, for example, the bit lines (186, 187), validity bit lines (193, 194) and parity bit lines (195, 196) form a single read/write port of the CAM array 101 which is used for both host-requested access to the CAM array and error scanning. Thus in the embodiment of FIGS. 2 and 12, an instruction decoder or other control circuit responds to a request to write data by disabling the scan controller 107 (e.g., by deasserting the enable signal, ENABLE) and selecting, via multiplexer 227, the comparand bus or other data source (e.g., an internal register, a data bus, etc.) a the source of write data. Similarly, during a read operation, the instruction decoder may disable the scan controller 107 to enable the read/write port to be used to perform a host-requested read operation or other type of read operation. In an alternative embodiment in which two or more read and/or write ports are provided within the CAM array, error scanning may be proceed concurrently with host requested read and write operations.

Still referring to FIG. 12, at 503, the target row value is read from the CAM array at the write address. At 505, the parity contribution of the target entry is removed from the column parity word, for example, by exclusive-ORing the target entry with the column parity word. The efficacy of this operation relies upon the associative power of exclusive-OR operations and the fact that a value exclusive-ORed with itself is zero. Thus, if a column parity word, CP is formed by A⊕B⊕C, then the contribution of B may be removed from the column parity word by CP= (A⊕B⊕C)⊕B=(A⊕C)⊕(B⊕B)=A⊕C. Thus, because the column parity word was generated by exclusive-ORing the target row value with the other row values within the CAM array, exclusive-ORing the target row value with the column parity word efficiency cancels the contribution of the target row value from the column parity word. At 507, the parity contribution of the write data is applied to the column parity word by exclusive-ORing the write data and the column parity word. At 509, the write data value and corresponding row parity value are stored in the CAM array at the write address. As described above, the row parity value may be supplied with the write value or generated within the CAM device.

At this point the stored column parity word reflects the column parity of the updated CAM array but, depending on whether the current error scan cycle has progressed beyond the write address, the partial column parity word may still contain a contribution of the target row value. Thus, at 511, the scan address is compared with the write address to determine whether a row-check operation has been performed at the write address. If the scan address is greater than the write address, then a row check operation has been performed at the write address and the partial column parity word includes a contribution from the target row value. Accordingly, at 513, the parity contribution of the target row value is removed from the partial column parity word, for example, by exclusive-ORing the target row value with the partial column parity word. At 515, the parity condition of the write data is applied to the column parity word in an exclusive-OR operation, thereby updating the partial column parity word to reflect the parity of the updated CAM array. At 525, the scan controller is enabled to continue with the parity scan cycle and the write operation is concluded. Note that the comparison operation at 511 reflects an embodiment in which the scan address is sequenced from low- to high-numbered addresses. Other addresses may be used in alternative embodiments.

If, at 511, the scan address is determined not to be greater than the write address, then the scan address is compared for equality with the write address at 517. If the scan address is not equal to the write address, then the scan address has not yet progressed to the write address. Consequently, the target value has not been applied to the calculation of the partial column parity word (and therefore need not be removed) and the write data value, now stored at the write address, will be applied to the partial column parity word in the normal course of the error scan cycle. Accordingly, at 525 the scan controller is enabled to continue the parity scan cycle, and the write operation is concluded.

If the scan address is determined to be equal to the write address (517), then the write operation is inspected at 519 to determine whether the write operation is a mask write or a data write (i.e., if the mask data and write data are not written at the same time). If the write operation is a data write operation, the scan controller state is evaluated at 521 to determine how far the current row check operation has progressed. That is, if the error scan cycle was suspended before the data value was read, then the target row value has not been applied to the column parity calculation and the updated data value (i.e., the write value) will be read and applied to the partial column parity word in the normal course when the error-scan cycle is resumed. Accordingly, if the scan controller state indicates that the data value at the scan address has not yet been read (521), the scan controller is re-enabled at 525 and the write operation concluded. If the parity scan state indicates that the data value at the scan address has been read, then the operation at 513 and 515 are performed to remove the parity contribution of the data value component of the target row value from the partial column parity word and to apply the parity contribution of the write value to the partial column parity word. The scan controller is then re-enabled at 525 and write operation concluded.

If, at 519, the write operation is determined to be a mask write operation rather than a data write operation, then at 523 the parity scan state is evaluated to determine whether the mask value at the scan address has been read. If the mask value has been read, then the operations at 513 and 515 are performed to remove the contribution of the mask value component of the target row value from the partial column parity word, and to apply the parity contribution of the write value to the partial column parity word. The scan controller is then re-enabled at 525 and the write operation concluded.

It should be noted that in an embodiment in which both a mask value and a data value are read from the CAM array and concatenated to form a unified row value for the purpose of updating the column parity word, then the determinations at 519, 521 and 523 may be simplified to a determination of whether the latter-read of the mask and data values has been read as part of the current row check operation. For example, in an embodiment in which the mask value is read first, and the data value is read second prior to updating the column parity value, then the determinations at 519, 521 and 523 may be replaced by a single decision block that determines whether the current row check operation has progressed beyond the data read. If the row check operation has progressed beyond the data read, then the parity contribution of the portion of the unified row value to be overwritten (i.e., the mask or data portion) is removed from the corresponding portion of the partial column parity word and the write value contribution added to the portion of the column parity word.

Figure 13:
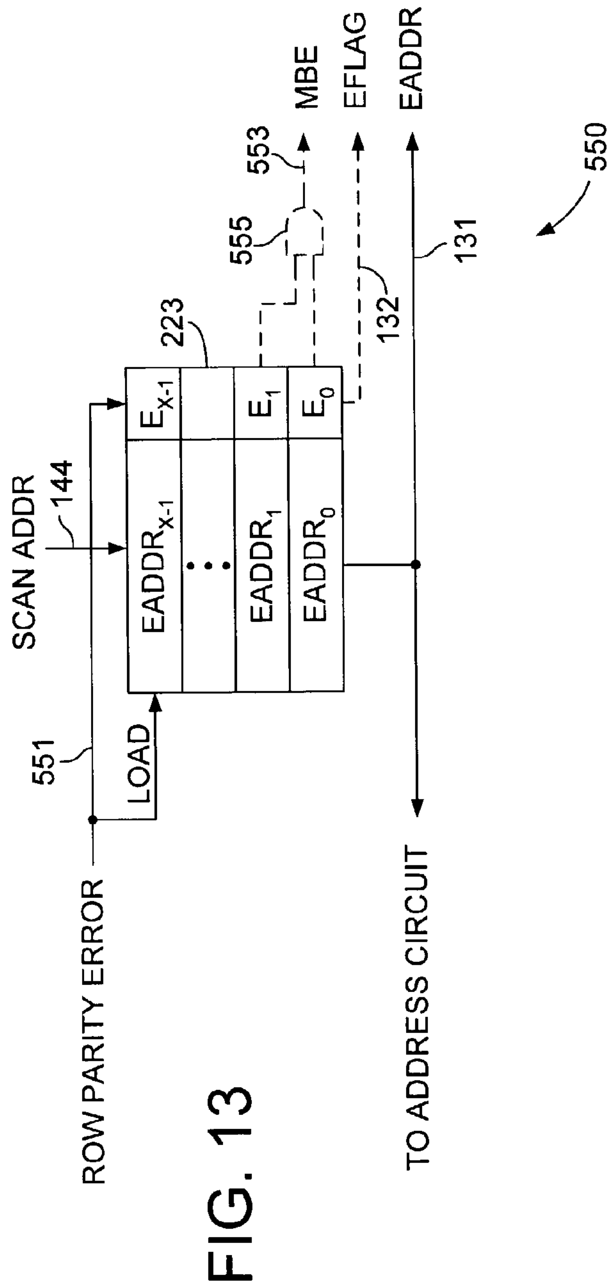
FIG. 13 illustrates an error address register according to an embodiment of the invention.

FIG. 13 illustrates an error address register 223 according to an embodiment of the invention. The error address register 223 includes storage for multiple error address entries, each entry including an error address field (EADDR) and a validity field (E). The error address field is used to store error addresses (i.e., scan addresses for which a row parity error is signaled), and the validity field is used to store an error bit that indicates whether the corresponding error address field is empty (error bit reset) or loaded with an error address (error bit set). In one embodiment, the error address register 223 is implemented by a queue circuit having head and tail entries (e.g., a shift register operated as a first-in, first-out circuit). A scan address and corresponding error bit is loaded into the tail entry of the queue in response to each assertion of a row parity error indicator 551 (e.g., a signal asserted by the row parity checker 229 of FIG. 2). The least recently loaded scan address (i.e., the oldest error address) is present at the head entry of the queue and is output as an error address 131. The error address may be stored elsewhere within the CAM device (e.g., a device status register) and/or output as an error signal to another device. The error address is also supplied to an address circuit (e.g., circuit 103 of FIG. 1) where it is used to address a row of the CAM array during an error correction operation. After an error has been cleared by a correction operation, the contents of the error address register are advanced, expelling the error address and error bit from the head of the error address register 223. The error bit at the head of the queue, $E_0$, is optionally used to drive an error signal 132. Also, in the event of multiple row parity error detections, the error bit at the head of the queue, $E_0$, and the error bit at the second position within the queue, $E_1$, will both be set. Accordingly, error bits $E_0$ and $E_1$ may be input to an AND gate 553 to generate a multi-bit error signal 553. In addition to being used to indicate the device error status, the error signal 132 and the multi-bit error signal 553 may be used within the scan controller to determine the error count (e.g., for the decisions shown at 291 and 295 of FIG. 4), obviating storage of a separate error count value.

It should be noted that numerous other architectures may be used to implement an error address register. For example, the error address register may be a single-entry rather than multi-entry storage. Also, the error address register may itself be a CAM (i.e., an error CAM) to permit indices generated during search operations to be compared with error addresses stored within the error address register. Matches between a search-generated index and an error address value within the error address register would indicate that the search-generated index resulted from a match with a corrupted CAM word. Thus, any match signal generated by the error CAM may be used to qualify the corresponding search-generated index.

Figure 14:
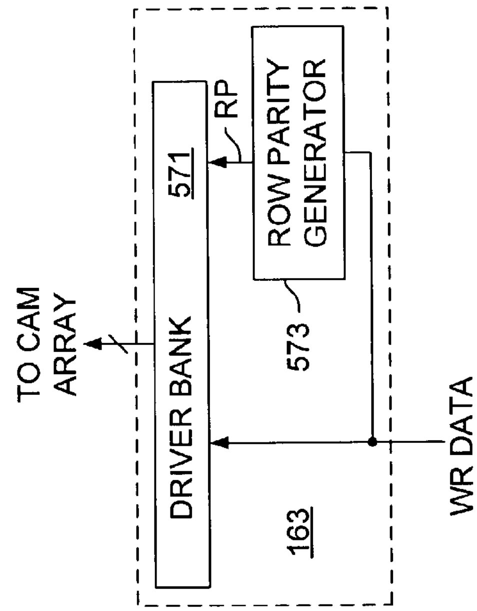
FIG. 14 illustrates an embodiment of a write driver circuit that includes a driver bank and a row parity generator.

FIG. 14 illustrates an embodiment of a write driver circuit 163 that includes a driver bank 571 (e.g., a plurality of differential output drivers to drive differential signals onto the bit lines of the CAM array) and a row parity generator 573. A write data value (WR DATA), which may be a corrected row value, is supplied to the driver bank 307 within the write driver circuit and also to the row parity generator 573. In one embodiment the row parity generator 573 includes combinatorial logic (e.g., exclusive-OR gates) to carry out the operation: $RP=WD_N \oplus WD_{N-1} \oplus \ldots \oplus WD_1$, where RP is the row parity value generated by the row parity generator and $WD_1$ is a bit of the write data value. As shown in FIG. 14, the row parity value is supplied to the driver bank 307 so that the driver bank 571 drives the write data value (optionally including a validity bit) and the row parity value onto bit lines of the CAM array to enable the values to be stored in a word-line-selected row of CAM cells. In an alternative embodiment, the row parity generator 573 may be omitted from the write driver circuit 163 and the row parity value generated by another source either within or outside the CAM device.

Figure 15:
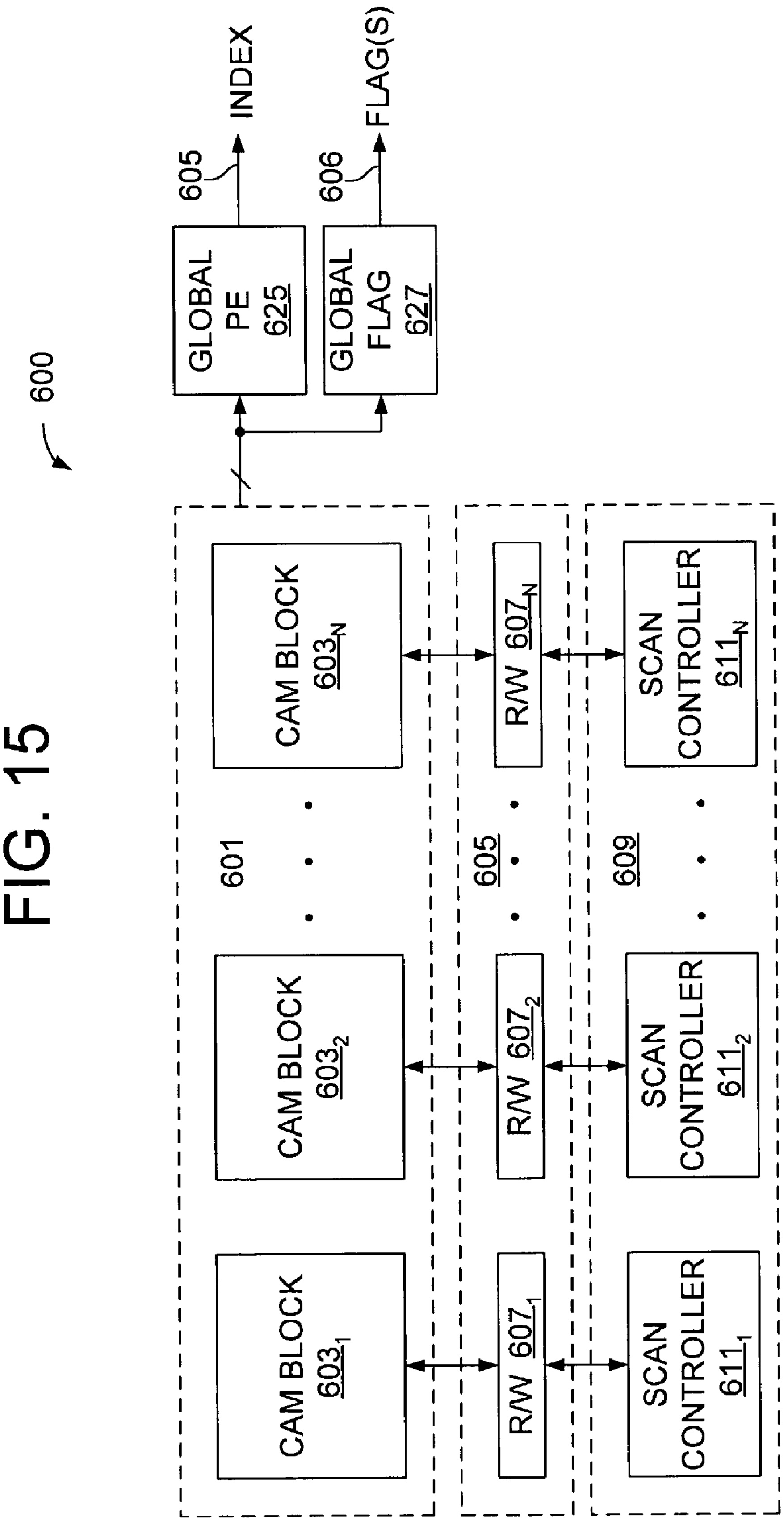
FIG. 15 illustrates a multi-block CAM device according to an embodiment of the invention.

FIG. 15 illustrates a multi-block CAM device 600 according to an embodiment of the invention. The CAM device 600 includes a multi-block CAM array 601, block-based read/write circuit 605, block-based scan controller 609, global priority encoder 625 and global flag circuit 627. The multi-block CAM array 601 includes N CAM blocks $603_1$–$603_N$, each of which is independently accessible via a respective read/write circuit $607_1$–$607_N$ within the block-based read/write circuit 605. Each CAM block 603 is analogous to the CAM array 101 of FIG. 1 and, though not shown in FIG. 15, is associated with a respective block priority encoder and block flag circuit (e.g., analogous to circuits 114 and 112 of FIG. 1). The global priority encoder 625 and global flag circuit 627 are used to generate an overall device index and device flag signals 605 and 606, based on block-level index and flag signals, respectively.

The block-based read/write circuit 605 includes a plurality of read/write sub-circuits $\mathbf{607}_1$–$\mathbf{607}_N$ to provide and write access to the CAM blocks $\mathbf{603}_1$–$\mathbf{603}_N$, respectively. The block-based scan controller 609 similarly includes a plurality of scan sub-controllers $\mathbf{611}_1$–$\mathbf{611}_N$ to perform error scanning operations on the CAM blocks $\mathbf{603}_1$–$\mathbf{603}_N$. That is, each scan sub-controller 611 operates generally as described in reference to FIGS. 1–13 to detect row and column parity errors within the corresponding CAM block 603 and to correct such errors by generating corrected row values and writing the corrected values back to the CAM block 603.

In one embodiment, referred to herein as a unified address embodiment, the CAM device 600 includes a single address circuit (not shown in FIG. 15) that is coupled to all the CAM blocks 603 via a common set of word lines. When a word line is activated during a host requested read or write access, two or more of the CAM blocks may be written to or read from concurrently. Thus, in the unified address embodiment, error scanning in each of the CAM blocks 603 may be carried out concurrently, with the same row of each CAM block being checked during a given row check operation. Accordingly, a single scan address sequencer (i.e., analogous to element 225 of FIG. 2) may be provided to generate the sequence of scan addresses rather than including a dedicated address sequencer within each scan sub-controller 611. In an alternative embodiment, separate address circuits and word lines are provided for each CAM block 603 to enable concurrent read/write access to two or more of the CAM blocks 603 at different addresses. By this arrangement, error scanning of the CAM blocks 603 may be carried out independently such that, if error scanning is suspended in a given CAM block 603 (e.g., to execute host-requested access to the CAM block), error scanning may continue in others of the CAM blocks. In such an embodiment, dedicated scan address sequencers may be provided within each of the scan sub-controllers 611.

As indicated above, the various embodiments described above can also be adapted to use more than one row parity error bit per row and/or more than one column parity error bit per columns. For example, if more than one row parity error bit is used per row (e.g., multiple columns of row parity cells each storing row parity bits corresponding to a group of bits in a corresponding row of CAM cells), separate scan controllers may be used to process the row parity bits, update the partial column parity word, column parity word and access the CAM cells in the CAM array. Processing of the row parity bits may be performed simultaneously or sequentially. For other embodiments, a common scan controller may be used and the row parity bits processed in a time-multiplexed manner. Separate variables for the row parity check, row correction, and error count, may be maintained for each column of parity error bits.

Multiple column parity bits per column of CAM cells may also be used. For example, multiple rows of column parity cells, each for storing column parity bits corresponding to a group of bits in a corresponding column of CAM cells, may be used (e.g., odd and even rows in the CAM array may each have a corresponding column parity word, or any other logical subdivisions or rows within the CAM array). In these embodiments, separate column parity words are formed by the multiple column bits per row, and each column parity word can be separately maintained by a common scan controller or by a separate scan controllers. The scan controller(s) would update the partial column parity word and column parity words based on whether the scan address indicated that a particular address is within the address space associated with a corresponding column parity word. The scan controller(s) can access the corresponding CAM cells in the CAM array either simultaneously or sequentially. Similarly, the scan controller(s) can access the row parity bits simultaneously or sequentially. Note that other embodiments may have multiple column parity words and multiple columns of row parity bits.

Although the invention has been described with reference to specific exemplary embodiments thereof, it will be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A content addressable memory (CAM) device comprising:

a plurality of CAM cells;

a plurality of row parity storage elements to store row parity values that correspond to contents of respective rows of the CAM cells;

a plurality of column parity storage elements to store column parity values that correspond to contents of respective columns of the CAM cells; and a write circuit to provide an input value to a selected row of the CAM cells, the write circuit including a row parity generator to generate an updated row parity value based on the input value, wherein the write circuit is adapted to provide the updated row parity value to one of the row parity storage elements that corresponds to the selected row of the CAM cells, and wherein the write circuit is adapted to provide the updated row parity value to the one of the row parity storage elements concurrently with providing the input value to the selected row of the CAM cells.

2. A content addressable memory (CAM) device comprising:

a plurality of CAM cells;

a plurality of row parity storage elements to store row parity values that correspond to contents of respective rows of the CAM cells;

a plurality of column parity storage elements to store column parity values that correspond to contents of respective columns of the CAM cells; and a parity control circuit to remove, in response to a write request, a parity contribution of a value stored within a selected row of the CAM cells from a column parity word stored within the column parity storage elements, the column parity word being formed by the column parity values.

3. The CAM device of claim 2 wherein the parity control circuit comprises circuitry to exclusive-OR the column parity word with the value stored within the selected row to remove the parity contribution of the value stored within the selected row from the column parity word.

4. The CAM device of claim 2 further comprising a write circuit to store an input value in the selected row of the CAM cells in response to the write request.

5. The CAM device of claim device of claim 4 wherein the parity control circuit is adapted to apply a parity contribution of the input value to the column parity word after the parity contribution of the value stored within the selected row of the CAM cells has been removed from the column parity word.

6. The CAM device of claim 5 wherein the parity control circuit comprises circuitry to apply the parity contribution of the input value to the column parity word by exclusive-ORing the input value with the column parity word.

7. A content addressable memory (CAM) device comprising:

a plurality of CAM cells;

a plurality of row parity storage elements to store row parity values that correspond to contents of respective rows of the CAM cells;

a plurality of column parity storage elements to store column parity values that correspond to contents of respective columns of the CAM cells; and a parity control circuit to read rows of the CAM cells in a predetermined sequence and to logically combine values read from the rows to generate a column parity word, the column parity word comprising the column parity values.

8. The CAM device of claim 7 wherein the parity control circuit comprises an exclusive-OR circuit to exclusive-OR the values read from the rows with one another to generate the column parity word.

9. The CAM device of claim 7 wherein the parity control circuit comprises an address sequencer to generate a sequence of addresses that define the predetermined sequence.

10. The CAM device of claim 9 wherein the parity control circuit comprises:

a partial column parity storage circuit coupled to store a partial column parity word; and an exclusive-OR circuit coupled to the partial column parity storage circuit and coupled to receive each of the values read from the rows of the CAM cells, the exclusive-OR circuit being adapted to exclusive-OR, in succession, each of the values read from the rows with the partial column parity word stored within the partial column parity storage circuit to generate an updated partial column parity word.

11. The CAM device of claim 10 wherein the parity control circuit is adapted to transfer the partial column parity word from the partial column parity storage circuit to the plurality of column parity storage elements after a value read from a final row in the scan sequence is exclusive-ORed with the partial column parity word.

12. The CAM device of claim 7 wherein the parity control circuit is adapted to remove a parity contribution of a first value from the column parity word in response to an indication that the first value is to be overwritten in a write operation.

13. The CAM device of claim 12 wherein the parity control circuit comprises a circuit to remove the parity contribution of the first value from the column parity word by exclusive-ORing the first value with the column parity word.

14. The CAM device of claim 12 wherein the parity control circuit comprises:

an address sequencer to output addresses one after another according to the predetermined sequence;

a compare circuit to compare one of the addresses output by the address sequencer with an address on the first value to determine whether the address sequencer has progressed beyond the address of the first value; and a logic circuit to exclusive-OR the first value with the column parity word if the compare circuit indicates that the address sequencer has progressed beyond the address of the first value.

15. The CAM device of claim 14 further comprising a write driver circuit to store a write data value at the address of the first value, and wherein the logic circuit is adapted to exclusive-OR the column parity word with the write data value if the compare circuit indicates that the address sequencer has progressed beyond the address of the first value.

16. The CAM device of claim 7 wherein at least one of the values read from the rows of the CAM cells comprises a mask value.

17. A content addressable memory (CAM) device comprising:

a CAM array including a plurality of CAM cells arranged in rows and columns, each row of CAM cells having a row address; and a scan controller coupled to the plurality of CAM cells to read a respective row value from each row of CAM cells in succession to determine whether the row value contains a row parity error, the scan control circuit including circuitry to combine the bits within each column of the CAM cells to determine whether the column contains a column parity error, and wherein, in response to determining that a first row value read from the CAM array contains a row parity error, and that a first column of bits within the CAM array contains a column parity error, the scan controller is adapted to correct a selected bit within the first row value to generate a corrected row value.

18. The CAM device of claim 17 further comprising a write circuit coupled to receive the corrected row value from the scan controller and coupled to the CAM array to provide the corrected row value thereto.

19. The CAM device of claim 18 wherein the scan controller comprises an error address register to store, as an error address, an address of the first row value in response to determining that the first row value comprises a row parity error.

20. The CAM device of claim 19 further comprising an address circuit coupled to receive the error address from the error address register and coupled to select a row of the CAM cells indicated by the error address, the corrected row value being provided by the write circuit to the row of CAM cells selected by the address circuit.

21. A method of operation within a content addressable memory (CAM) device, the method comprising:

storing a plurality of row parity values, each row parity value indicating a parity for a respective row of CAM cells within the CAM device; and storing a plurality of column parity values, each column parity value indicating a parity for a respective column of the CAM cells, wherein storing a plurality of column parity values comprises logically combining values stored within the rows of CAM cells to generate the column parity values, and wherein logically combining values stored within the rows of CAM cells to generate the column parity values comprises:

reading row values from the rows of the CAM cells; and exclusive-ORing the row values with one another to generate a column parity word, the column parity values being constituent bits of the column parity word.

22. The method of claim 21 wherein exclusive-ORing the row values with one another to generate the column parity word comprises exclusive-ORing each bit of each of the row values with a corresponding bit of a partial column parity word.

23. A method of operation within a content addressable memory (CAM) device, the method comprising:

storing a plurality of row parity values, each row parity value indicating a parity for a respective row of CAM cells within the CAM device;

storing a plurality of column parity values, each comprise parity values indicating a parity for a respective column of the CAM cells; and storing an input value within a selected row of the CAM cells after storing the plurality of row parity values and the plurality of column parity values, wherein storing the input value within the selected row of the CAM cells comprises:

reading a stored value from the selected row of the CAM cells;

removing a parity contribution of the stored value from the plurality of column parity values;

storing the input value within the selected row of the CAM cells; and applying a parity contribution of the input value to the plurality of column parity values.

24. The method of claim 23 wherein removing a parity contribution of the stored value from the plurality of column parity values comprises exclusive-ORing each bit of the stored value with a respective one of the column parity values.

25. The method of claim 23 wherein applying a parity contribution of the input value to the plurality of column parity values comprises exclusive-ORing each bit of the input value with a respective one of the column parity values.

26. A method of operation within a content addressable memory (CAM) device, the method comprising:

determining that a row value stored in a first row of CAM cells within the CAM device is a corrupted row value;

combining the corrupted row value with row values stored in other rows of CAM cells within the CAM device to generate an updated column parity word;

comparing the updated column parity word with a previously generated column parity word to determine a bit in error in the corrupted row value;

correcting the bit in error in the corrupted row value to generate a corrected row value; and wherein comparing the updated column parity word with a previously generated column parity word to determine the bit in error comprises exclusive-ORing the updated column parity word with the previously generated column parity word to produce a column syndrome value indicative of a location of the bit in error in the corrupted row value.

27. The method of claim 26 wherein correcting the bit in error in the corrupted row value to generate the corrected row value comprises exclusive-ORing the column syndrome value with the corrupted row value.

28. A method of operation within a content addressable memory (CAM) device, the method comprising:

determining that a row value stored in a first row of CAM cells within the CAM device is a corrupted row value;

combining the corrupted row value with row values stored in other rows of CAM cells within the CAM device to generate an updated column parity word;

comparing the updated column parity word with a previously generated column parity word to determine a bit in error in the corrupted row value; and wherein determining that a row value is a corrupted value comprises:

reading each row value stored within the CAM device;

for each row value, exclusive-ORing each of the constituent bits of the row value with one another to generate a parity-check bit that corresponds to the row value; and determining that the parity-check bit does not match a row parity bit associated with the corresponding row value.

29. The method of claim 28 wherein reading each row value stored within the CAM device comprises generating a sequence of scan addresses, each scan address corresponding to a respective row of CAM cells within the CAM device and having a row value stored therein.

30. The method of claim 29 further comprising storing, as an error address, a scan address that corresponds to the row of CAM cells having the corrupted row value stored therein.

31. The method of claim 30 further comprising:

correcting the bit in error in the compared row value to generate a corrected row value; and storing the corrected row at the error address.

32. A method of operation within a content addressable memory (CAM) device, the method comprising:

receiving a request to store a write value in a selected row of CAM cells in a CAM array;

reading a row value from the selected row of CAM cells in response to the request;

removing a parity contribution of the row value from a column parity word;

applying a parity contribution of the write value to the column parity word; and storing the write value in the selected row of CAM cells.

33. The method of claim 32 further comprising:

reading contents of each row of CAM cells in the CAM array; and logically combining the contents of each row of CAM cells with each other to generate an updated column parity word.

34. The method of claim 33 wherein reading contents of each row of CAM cells comprises reading each row of CAM cells one after another in a predetermined scan sequence.

35. The method of claim 34 wherein logically combining the contents of each row of CAM cells with each other comprises exclusive-ORing the contents of each row of CAM cells with a partial column parity word to generate an updated partial column parity word, wherein the updated partial column parity word becomes the updated column parity word when exclusive-ORed with the contents of a final row of CAM cells in the scan sequence.

36. The method of claim 35 further comprising exclusive-ORing the contents of the selected row of CAM cells with the partial column parity word if the contents of the selected row of CAM cells has been exclusive-ORed with the contents of the partial column parity word.

37. The method of claim 36 further comprising:

determining if the contents of the selected row of CAM cells has been exclusive-ORed with the contents of the partial column parity word; and exclusive-ORing the write value with the partial column parity word if the contents of the selected row of CAM cells has been exclusive-ORed with the contents of the partial column parity word.

38. A content addressable memory (CAM) device comprising:

a CAM array;

means for receiving a request to store a write value in a selected row of CAM cells in the CAM array;

means for reading a row value from the selected row of CAM cells in response to the request;

means for removing a parity contribution of the row value from a column parity word;

means for applying a parity contribution of the write value to the column parity word; and means for storing the write value in the selected row of CAM cells.

39. The CAM device of claim 38 further comprising:

means for reading contents of each row of CAM cells in the CAM array; and means for logically combining the contents of each row of CAM cells with each other to generate an updated column parity word.

40. The CAM device of claim 39 wherein the means for reading contents of each row of CAM cells comprises means for reading each row of CAM cells one after another in a predetermined scan sequence.

41. The CAM device of claim 40 wherein the means for logically combining the contents of each row of CAM cells with each other comprises means for exclusive-ORing the contents of each row of CAM cells with a partial column parity word to generate an updated partial column parity word, wherein the updated partial column parity word becomes the updated column parity word when exclusive-ORed with the contents of a final row of CAM cells in the scan sequence.

42. The CAM device of claim 41 further comprising means for exclusive-ORing the contents of the selected row of CAM cells with the partial column parity word if the contents of the selected row of CAM cells has been exclusive-ORed with the contents of the partial column parity word.

43. The CAM device of claim 42 further comprising:

means for determining if the contents of the selected row of CAM cells has been exclusive-ORed with the contents of the partial column parity word; and means for exclusive-ORing the write value with the partial column parity word if the contents of the selected row of CAM cells has been exclusive-ORed with the contents of the partial column parity word.

* * * * *

UNITED STATES PATENT AND TRADEMARK OFFICE
CERTIFICATE OF CORRECTION

PATENT NO. : 6,978,343 B1
APPLICATION NO. : 10/213244
DATED : August 5, 2002
INVENTOR(S) : Michael E. Ichiriu It is certified that error appears in the above-identified patent and that said Letters Patent is hereby corrected as shown below:

Claim 23, Column 23, lines 11 and 12, replace "each comprise parity values" with --each column parity value--.

Claim 31, Column 24, line 23, replace " compared row value " with --corrupted row value--.

Signed and Sealed this

Fifth Day of September, 2006

JON W. DUDAS
*Director of the United States Patent and Trademark Office*

UNITED STATES PATENT AND TRADEMARK OFFICE

CERTIFICATE OF CORRECTION

PATENT NO. : 6,978,343 B1
APPLICATION NO. : 10/213244
DATED : December 20, 2005
INVENTOR(S) : Michael E. Ichiriu It is certified that error appears in the above-identified patent and that said Letters Patent is hereby corrected as shown below:

Claim 23, Column 23, lines 11 and 12, replace “each comprise parity values” with --each column parity value--.

Claim 31, Column 24, line 23, replace “ compared row value ” with --corrupted row value--.

This certificate supersedes Certificate of Correction issued September 5, 2006.

Signed and Sealed this

Seventh Day of November, 2006

JON W. DUDAS

*Director of the United States Patent and Trademark Office*